(12) United States Patent
Fukue et al.

(10) Patent No.: US 10,270,412 B2
(45) Date of Patent: Apr. 23, 2019

(54) SOUND-FIELD CORRECTION DEVICE, SOUND-FIELD CORRECTION METHOD, AND SOUND-FIELD CORRECTION PROGRAM

(71) Applicant: Clarion Co., Ltd., Saitama (JP)

(72) Inventors: Kazutomo Fukue, Kitamoto (JP); Takeshi Hashimoto, Motomiya (JP); Tetsuo Watanabe, Hasuda (JP); Takatomi Kumagai, Saitama (JP); Yasuhiro Fujita, Kashiwa (JP)

(73) Assignee: Clarion Co., Ltd., Saitama (JP)

( * ) Notice: Subject to any disclaimer, the term of this patent is extended or adjusted under 35 U.S.C. 154(b) by 0 days.

(21) Appl. No.: 15/549,541

(22) PCT Filed: Feb. 12, 2016

(86) PCT No.: PCT/JP2016/054062
§ 371 (c)(1),
(2) Date: Aug. 8, 2017

(87) PCT Pub. No.: WO2016/133007
PCT Pub. Date: Aug. 25, 2016

(65) Prior Publication Data
US 2018/0034434 A1 Feb. 1, 2018

(30) Foreign Application Priority Data
Feb. 16, 2015 (JP) .................................. 2015-027163

(51) Int. Cl.
*H03G 5/16* (2006.01)
*H04S 7/00* (2006.01)
*G10K 15/00* (2006.01)

(52) U.S. Cl.
CPC ............... *H03G 5/165* (2013.01); *H03G 5/16* (2013.01); *H04S 7/301* (2013.01); *H04S 7/302* (2013.01);
(Continued)

(58) Field of Classification Search
CPC .......... H03G 5/165; H03G 5/16; H03G 5/025; H04S 7/00; H04R 3/04
(Continued)

(56) References Cited

U.S. PATENT DOCUMENTS 8,150,069 B2    4/2012  Nakano
2007/0133823 A1*  6/2007  Nakano .................. H03G 5/165
                                                    381/103
(Continued)

FOREIGN PATENT DOCUMENTS

EP    1253806 A2   10/2002
EP    1786241 A2   5/2007
(Continued)

OTHER PUBLICATIONS

International Preliminary Report on Patentability issued in Application No. PCT/JP2016/054062 dated Aug. 31, 2017 along with an English translation.
(Continued)

*Primary Examiner* — Thjuan K Addy
(74) *Attorney, Agent, or Firm* — McCarter & English, LLP

(57) ABSTRACT

A sound-field correction device, comprising: a target calculating unit, a correction amplitude characteristic calculating unit and a setting unit. The target calculating unit calculates, based on a predetermined sound signal, a target amplitude characteristic targeted for sound-field correction by a parametric equalizer and a plurality of auxiliary target amplitude characteristics having amplitude characteristics approxi-
(Continued)

mately equal to or gentler than the target amplitude characteristic. The correction amplitude characteristic calculating unit calculates a correction amplitude characteristic for correction sound-field based on the calculated target amplitude characteristic and the calculated plurality of auxiliary target amplitude characteristics. The setting unit sets the parametric equalizer based on the calculated correction amplitude characteristic.

13 Claims, 13 Drawing Sheets

(52) U.S. Cl.
CPC .............. *H04S 7/307* (2013.01); *G10K 15/00* (2013.01); *H04R 2499/13* (2013.01)
(58) Field of Classification Search
USPC .................. 381/103, 104, 102, 98, 101, 106
See application file for complete search history.

(56) References Cited

U.S. PATENT DOCUMENTS

| | | |
|---|---|---|
| 2007/0230556 A1 | 10/2007 | Nakano |
| 2008/0037805 A1 | 2/2008 | Kino et al. |
| 2008/0260170 A1* | 10/2008 | Nakano .................. H04S 7/301 381/59 |
| 2013/0329899 A1 | 12/2013 | Miseki et al. |

FOREIGN PATENT DOCUMENTS

| | | |
|---|---|---|
| EP | 1928211 A2 | 6/2008 |
| JP | H0653767 A | 2/1994 |
| JP | 2007189317 A | 7/2007 |
| JP | 2007288468 A | 11/2007 |
| JP | 2007295528 A | 11/2007 |
| JP | 2008205803 A | 9/2008 |
| JP | 2008245123 A | 10/2008 |
| JP | 2010122404 A | 6/2010 |
| JP | 2013253884 A | 12/2013 |

OTHER PUBLICATIONS

International Search Report of the International Searching Authority dated Apr. 26, 2016, along with its English translation, issued in connection with International Application No. PCT/JP2016/054062 (5 pages).

Written Opinion of the International Searching Authority dated Apr. 26, 2016, issued in connection with International Application No. PCT/JP2016/054062 (5 pages).

Extended European Search Report dated Sep. 5, 2018, issued in connection with European Patent Application No. 16752393.5 (8 pages).

Japanese Office Action dated Jan. 22, 2019, in connection with Japanese Patent Application No. 2015-027163, along with English translation thereof (7 pages).

* cited by examiner

SOUND-FIELD CORRECTION DEVICE, SOUND-FIELD CORRECTION METHOD, AND SOUND-FIELD CORRECTION PROGRAM

RELATED APPLICATIONS

This application is a U.S. National Phase Application under 35 U.S.C. 371 of International Application No. PCT/JP2016/054062 filed Feb. 12, 2016, which claims the benefit of Japanese Patent Application No. 2015-027163 filed on Feb. 16, 2015. The disclosures of these applications are incorporated herein by reference in their entireties.

TECHNICAL FIELD

The present invention relates a sound-field correction device, a sound-field correction method and a sound-field correction program.

BACKGROUND ART

A sound-filed correction device configured to adjust, for each of frequency bands. an output level of a sound signal of sound output from a speaker (hereafter, referred to as "sound-filed measurement sound") based on a difference between the sound-filed measurement sound and sound (hereafter, referred to as "microphone recorded sound") recorded by a microphone disposed at a listening position is known. A concrete configuration of the sound-field correction device of this type is described, for example, in Japanese Patent Provisional Publications Nos. 2007-295528A (hereafter, referred to as "patent document 1") and 2008-245123A (hereafter, referred to as "patent document 2").

SUMMARY OF THE INVENTION

The sound-field correction device described in the patent document 1 is configured to determine the center frequency based on a frequency at which the gain difference from a target characteristic in an area included in a frequency range of a correction target is maximized, to determine a gain value at the determined center frequency based on the gain difference from the target characteristic at the center frequency, and further to determine a Q-value from among predetermined candidates. However, regarding the configuration described in the patent document 1, it may be difficult to precisely correct the area because the shape and the barycenter of the gain difference from the target characteristic in the area are not considered.

The sound-filed correction device described in the patent document 2 is configured to calculate, for each of frequency bands, a signal correction level based on the microphone recorded sound, to group the frequency band into a plurality of groups based on an inflection point of a waveform of a correction level obtained by connecting the calculated signal correction levels in the order of frequency band, and to perform the level correction group by group. The configuration described in the patent document 2 is suitable in regard to precisely performing the level correction because a barycenter in a group is considered. However, in this case, a problem arises that, depending on the result of the grouping process, the characteristic of a parametric equalizer becomes steep, and thereby adequate advantages of the correction cannot be derived when the number of bands is small.

The present invention is made in view of the above described circumstances. That is, the object of the present invention is to provide a sound-field correction device, a sound-field correction method and a sound-field correction program suitable for achieving adequate sound-field correction effects even when the number of bands of a parametric equalizer is small.

According to an embodiment of the invention, a sound-field correction device, comprises: a target calculating means that calculates, based on a predetermined sound signal, a target amplitude characteristic targeted for sound-field correction by a parametric equalizer and a plurality of auxiliary target amplitude characteristics having amplitude characteristics approximately equal to or gentler than the target amplitude characteristic; a correction amplitude characteristic calculating means that calculates a correction amplitude characteristic for correcting sound-filed based on the calculated target amplitude characteristic and the plurality of auxiliary target amplitude characteristics; and a setting means that sets the parametric equalizer based on the calculated correction amplitude characteristic.

In an embodiment of the invention, the target calculating means may calculate an amplitude characteristic of the sound signal based on the sound signal, may subject the calculated amplitude characteristic to an averaging process in a first resolution, and may calculate the target amplitude characteristic based on the amplitude characteristic subjected to the averaging process. The target calculating means may calculate the amplitude characteristic of the sound signal based on the sound signal, may subject the calculated amplitude characteristic to an averaging process in a resolution approximately equal to the first resolution or in a plurality of types of resolutions which are rougher than the first resolution and are different from each other, and may calculate the plurality of auxiliary target amplitude characteristics based on the amplitude characteristics subjected to the averaging process in the plurality of types of resolutions different from each other.

In an embodiment of the invention, the correction amplitude characteristic calculating means may divide each of the auxiliary target amplitude characteristics into a plurality of groups in a frequency domain based on a predetermined condition, may calculate priority of each of the divided groups, and may select a group having highest calculated priority for each of the auxiliary target amplitude characteristics. The correction amplitude characteristic calculating means may calculate a parameter of the parametric equalizer of a correction candidate for each of the auxiliary target amplitude characteristics based on the selected group in the frequency domain, and may obtain the parameter of the parametric equalizer of a correction target based on the calculated parameter of each of the auxiliary target amplitude characteristics. In this case, the setting means may set the parametric equalizer based on the parameter of the parametric equalizer of the correction target.

In an embodiment of the invention, the correction amplitude characteristic calculating means may calculate an amplitude characteristic of the correction candidate for each of the auxiliary target amplitude characteristics based on the parameter of the parametric equalizer of the correction candidate, and may obtain, as the parameter of the parametric equalizer of the correction target, the parameter of one of amplitude characteristics of the calculated respective correction candidates having a smallest difference with respect to the target amplitude characteristic.

In an embodiment of the invention, when the parameter of the parametric equalizer of the correction target is obtained, the correction amplitude characteristic calculating means may calculate, as a new target amplitude characteristic, a difference between the target amplitude characteristic and one of the amplitude characteristics of the correction candidates calculated for the respective auxiliary target amplitude characteristics having a smallest difference with respect to the target amplitude characteristic, and may calculate, as a new plurality of auxiliary target amplitude characteristics, differences between the amplitude characteristic of the correction target and the respective auxiliary target amplitude characteristics. When a number of obtained parametric equalizers of the correction target does not reach a predetermined number, the correction amplitude characteristic calculating means may further obtain the parameter of the parametric equalizer of the correction target based on the new target amplitude characteristic and the new plurality of auxiliary target amplitude characteristic.

In an embodiment of the invention, the parameter may include a center frequency, a gain and a frequency band width.

According to an embodiment of the invention, a sound-field correction method, comprises: a target calculating step of that calculating, based on a predetermined sound signal, a target amplitude characteristic targeted for sound-field correction by a parametric equalizer and a plurality of auxiliary target amplitude characteristics having amplitude characteristics approximately equal to or gender than the target amplitude characteristic; a correction amplitude characteristic calculating step of calculating a correction amplitude characteristic for correcting sound-filed based on the calculated target amplitude characteristic and the plurality of auxiliary target amplitude characteristics; and a setting step of setting the parametric equalizer based on the calculated correction amplitude characteristic.

According to an embodiment of the invention, a sound-filed correction program is a program for causing a computer to execute the above described sound-field correction method.

According to the embodiment of the invention, a sound-field correction device, a sound-field correction method and a sound-field correction program suitable for achieving adequate sound-field correction effects even when the number of bands of a parametric equalizer is small are provided.

EMBODIMENTS FOR CARRYING OUT THE INVENTION

Hereafter, an embodiment of the invention is described with reference to the accompanying drawings. In the following, an acoustic system disposed in a vehicle interior is explained as an embodiment of the invention.

[Outline of Acoustic System 1]

Figure 1:
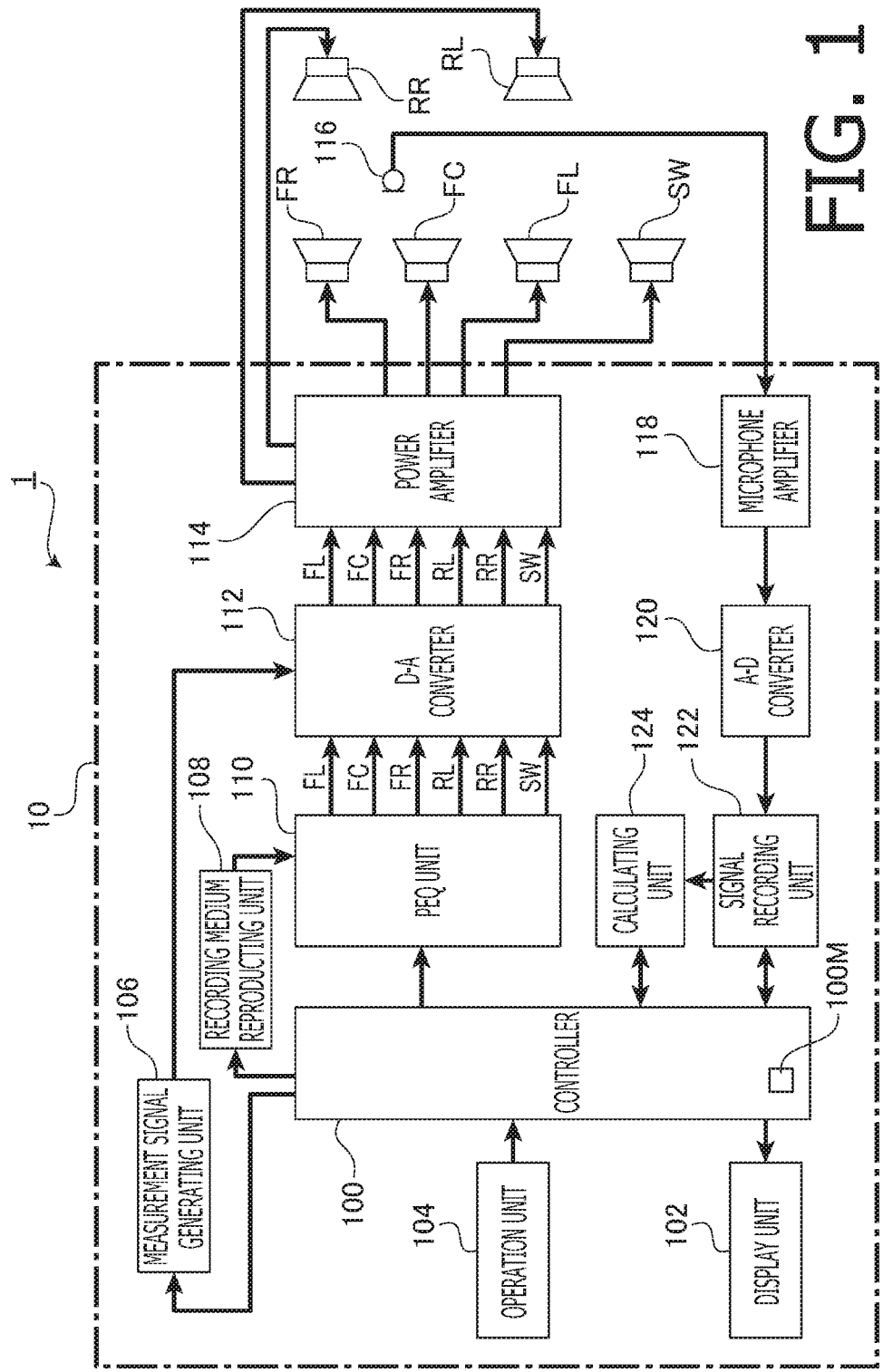
FIG. 1 is a block diagram illustrating a configuration of an acoustic system according to an embodiment of the invention.

FIG. 1 is a block diagram illustrating a configuration of an acoustic system 1 according to the embodiment of the invention. The acoustic system 1 according to the embodiment is provided with the sound-field correction function (a sound-field correction device) configured to correct the sound-filed under a listening environment of a vehicle interior, and, more particularly to adjust, for each of frequency bands, signal levels of respective frequency bands of a sound signal output by each of a plurality of speakers disposed in the vehicle interior.

It should be noted that various processes in the acoustic system 1 are executed under cooperation between hardware and software provided in the acoustic system 1. At least an OS (Operating System) of the software of the acoustic system 1 is provided as an embedded system, and the other part of the software, such as a software module for executing the sound-field correction, may be provided as an application which can be distributed via a network or an application storable on a recording medium such as a memory card. That is, the sound-filed correction function according to the embodiment may be the function embedded in advance in the acoustic system 1 or may be the function which can be added to the acoustic system 1 via a network or a recording medium.

As shown in FIG. 1, the acoustic system 1 includes a sound-field device 10, a microphone 116, and speakers FC, FR, RR, RL and SW. The speaker FC is a center speaker disposed at a frontward center position in the vehicle interior, the speaker FR is a front right speaker disposed at a frontward right position in the vehicle interior, the speaker FL is a front left speaker disposed at a frontward left position in the vehicle interior, the speaker RR is a rear right speaker disposed at a rearward right position in the vehicle interior, the speaker RL is a rear left speaker disposed at a rearward left position in the vehicle interior, and the speaker SW is a sub-woofer disposed a rearward center position in the vehicle interior.

The sound-filed device 10 includes a controller 100, a display unit 102, an operation unit 104, a measurement signal generating unit 106, a recording medium reproducing unit 108, a PEQ (Parametric Equalizer) unit 110, a D-A converter 112, a power amplifier 114, a microphone amplifier 118, an A-D converter 120, a signal recording unit 122 and a calculating unit 124.

(Sound-field Measuring Process)

Figure 2:
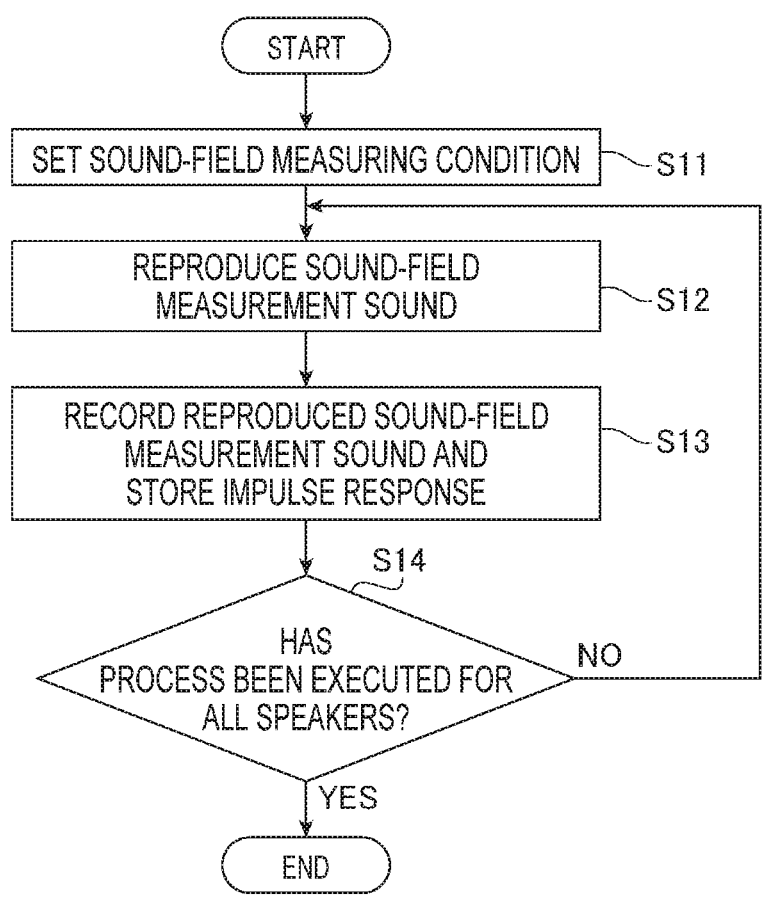
FIG. 2 is a flowchart illustrating a sound-field measuring process executed on the acoustic system according to the embodiment of the invention.

FIG. 2 is a flowchart illustrating a sound-field measuring process executed on the acoustic system 1 according to the embodiment of the invention. Various processes including the sound-filed measuring process shown in the flowchart are executed on the acoustic system 1 under control of the controller 100. When the controller 100 receives a predetermined touching operation to the display unit 102 or a predetermined operation to the operation unit 104, the controller 100 displays an input screen for a sound-field measuring condition on the display unit 102. As a result, the sound-filed measuring process shown in the flowchart is started.

(S11 in FIG. 2 (Setting of Sound-field Measuring Condition))

In step S11, when the sound filed measuring condition is input by a user through the input screen displayed on the display unit 102, the input sound filed measuring condition is set. The sound-field condition input herein is, for example, the number of channels (or designation of a target speaker). Since the acoustic system 1 according to the embodiment is mounted with six speakers, the maximum number of channels which can be input is six. In the following, explanation is given assuming that the input number of channels is six.

(S12 in FIG. 2 (Reproduction of Sound-filed Measurement Sound))

In step S12, the measurement signal generating unit 106 generates a predetermined measurement signal. The generated measurement signal is, for example, a M-sequence signal (Maximal length sequence) or a TSP signal (Time Stretched Pulse), and is sequentially input to the speakers FC, FR, FL, RR, RL and SW set in step S11 (setting of sound-filed measuring condition) at predetermined time intervals via the D-A converter 112 and the power amplifier 114. As a result, the predetermined sound-filed measurement sound is sequentially reproduced from the speakers FC, FR, FL, RR, RL and SW at predetermined time intervals.

(S13 in FIG. 2 (Storing of Impulse Response))

In this embodiment, four seats (a driver's seat, an assistant driver's seat, a pair of left and right rear seats) are disposed in the vehicle interior. In order to appropriately perform the sound-filed correction for respective vehicle passengers of the four seats, the microphone 116 is disposed at a position (a center of the four seats) having an equal distance from the respective seats. The position of the microphone 116 may vary depending on a passenger whom the effect of the sound-filed correction should be presented (i.e., a position of the passenger in the vehicle interior). For example, when the effect of the sound-filed correction should be presented to a driver, the microphone 116 is set on the driver's seat.

In step S13, the sound-filed measurement sound reproduced in step S12 (reproduction of sound-filed measurement sound) is recorded by the microphone 116, and is input to the signal recording unit 122 via the microphone amplifier 118 and the A-D converter 120. In the signal recording unit 122, an impulse response is calculated. The impulse response is obtained, for example, by Fourier-transforming the input sound-filed measurement sound and an inverse reference signal obtained by reversing the reference measurement signal (e.g., a TSP signal) on a time axis, multiplying the Fourier-transformed signals together on a frequency domain, and then executing the inverse Fourier-transformation for the multiplied value. The calculated impulse response is stored in an internal memory 100M of the controller 100.

Step S12 (reproduction of sound-filed measurement sound) and step S13 (storing of impulse response) are executed for each of the speakers set in step S11 (setting of sound-filed measuring condition). When step S12 (reproduction of sound-filed measurement sound) and step S13 (storing of impulse response) are executed for all the speakers set in step S11 (setting of sound-filed measuring condition) (S14: YES), the sound-filed measuring process shown in the flowchart is finished.

(Sound-filed Correction Process)

Figure 3A:
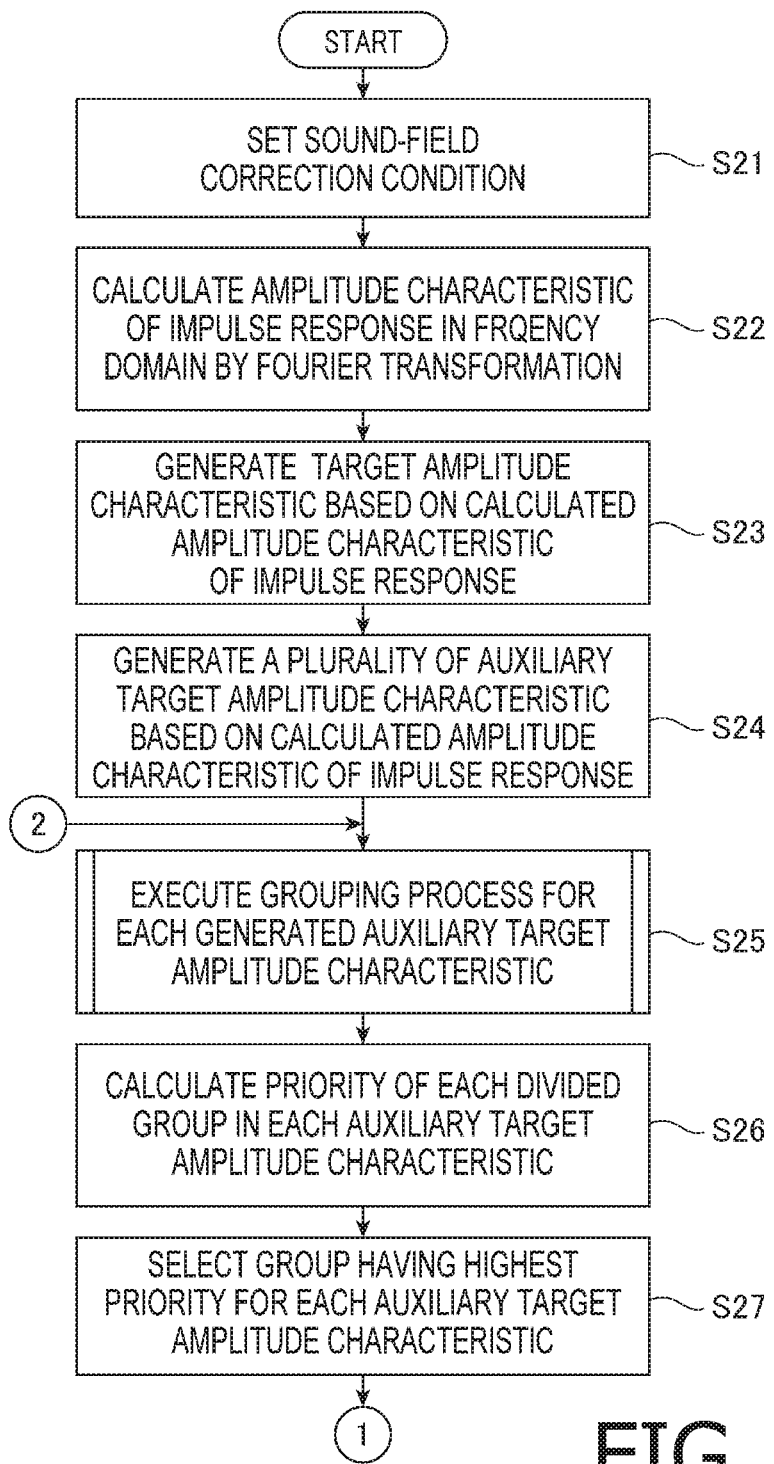
FIG. 3A is a flowchart illustrating a sound-filed correction process executed on the acoustic system according to the embodiment of the invention.
Figure 3B:
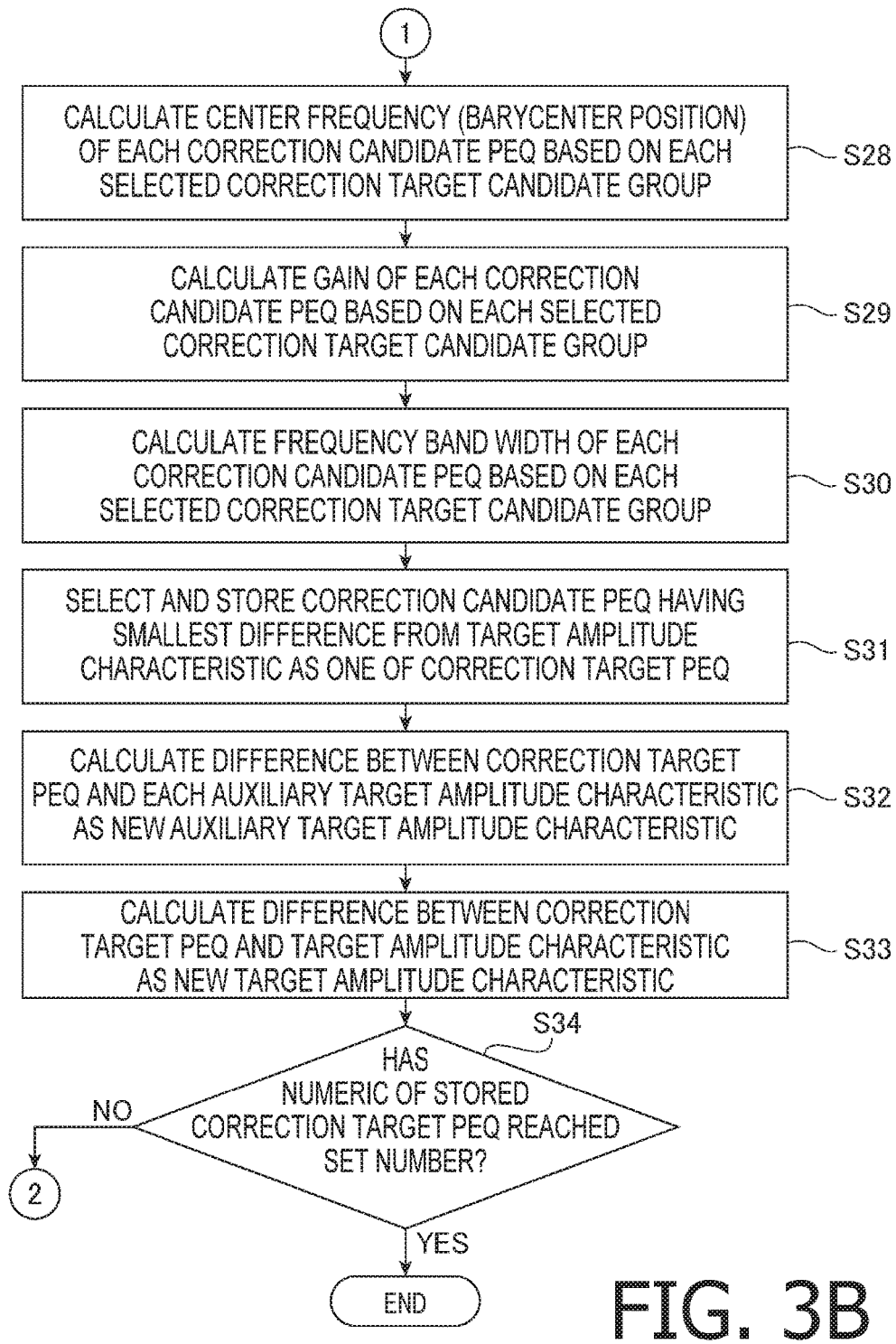
FIG. 3B is a flowchart illustrating the sound-filed correction process executed on the acoustic system according to the embodiment of the invention.

FIGS. 3A and 3B show a flowchart illustrating a sound-filed correction process executed on the acoustic system 1 according to the embodiment of the invention. The sound-filed correction process shown in FIG. 3 is executed upon completion of the sound-filed measuring process shown in FIG. 2, and is executed for each of the speakers.

(Step S21 in FIG. 3A (Setting of Correction Condition))

In step S21, a setting screen for setting a correction condition is displayed on the display unit 102. When the correction condition is input by a user through the setting screen displayed on the display unit 102, the input correction condition is set. The correction condition input herein is a PEQ band number and a correction frequency range. The PEQ number represents the number of parametric equalizers assigned to one speaker, and is "seven" in this embodiment. The correction frequency range represents a frequency range to which the correction is applied, and is set, for each of the speakers, based on, for example, a reproducible frequency of each speaker.

(S22 in FIG. 3A (Calculation of Amplitude Characteristic of Impulse Response))

Figure 4:
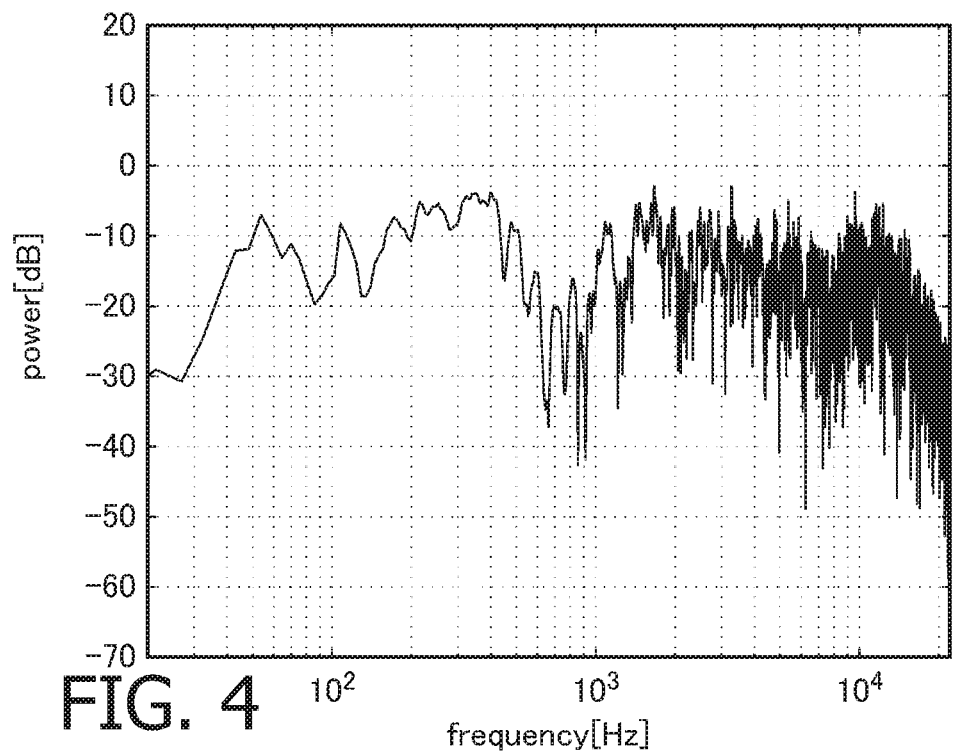
FIG. 4 shows an example of an amplitude characteristic of an impulse response calculated in step S22 (calculation of amplitude characteristic of impulse response) in FIG. 3A.

In step S22, the impulse response stored in step S13 (storing of impulse response) is read out, and the read impulse response is Fourier-transformed by the calculating unit 124 so that the amplitude characteristic of the impulse response in the frequency domain is calculated. FIG. 4 shows an example of the amplitude characteristic of the impulse response calculated herein. In FIG. 4, the vertical axis and the horizontal axis respectively represent the signal level (Power (unit: dB)) and the frequency (unit: Hz). Power is the square of the amplitude. The human listening characteristic is logarithmic with respect to the frequency. Therefore, the frequency of the horizontal axis is represented logarithmically in conformity with the human listening characteristic.

(S23 in FIG. 3A (Generation of Target Amplitude Characteristic))

In step S23, the calculating unit 124 executes smoothing (an averaging process) for the amplitude characteristic calculated in step S22 (calculation of amplitude characteristic of impulse response) by obtaining an average value of amplitude characteristic values within a predetermined sample number while shifting the sample position for the averaging process one by one. The averaging process is executed in resolution equivalent to the 1/3 octave width which is known as auditory frequency resolution.

Figure 5:
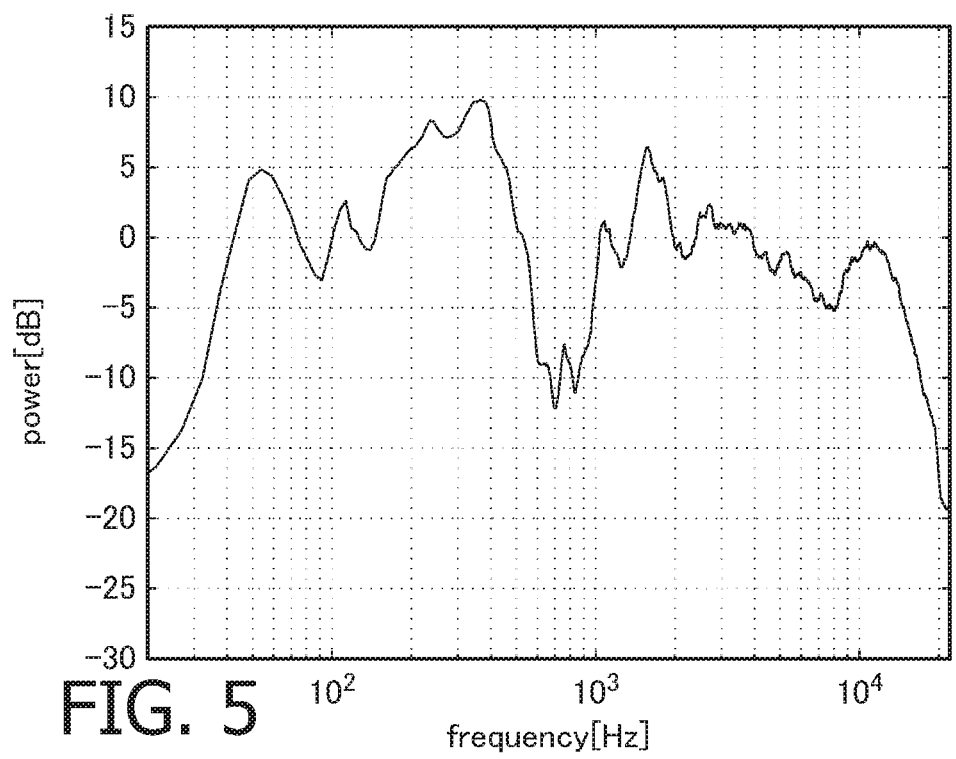
FIG. 5 shows an example of a normalized amplitude characteristic of the impulse response calculated in step S23 (generation of target amplitude characteristic) in FIG. 3A.

Next, a normalized amplitude characteristic of the impulse response is calculated based on a signal level in a reference band width (500 Hz-3000 Hz in this embodiment). FIG. 5 shows an example of the normalized amplitude characteristic of the impulse response calculated herein.

Figure 6:
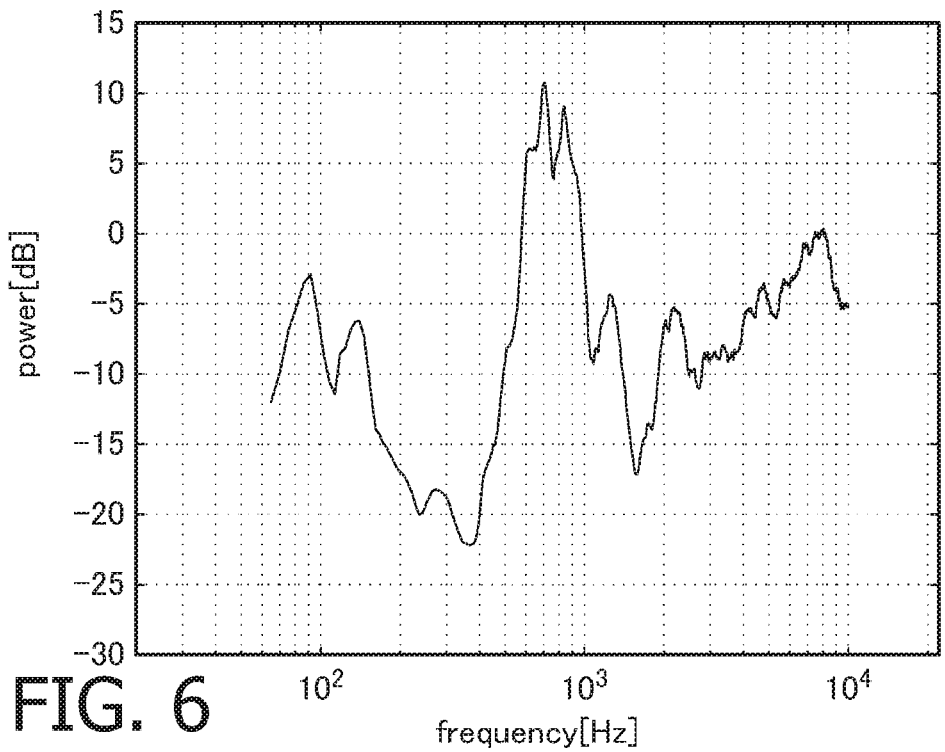
FIG. 6 shows an example of a target amplitude characteristic generated in step S23 (generation of target amplitude characteristic) in FIG. 3A.

A sign of the signal level of the calculated normalized amplitude characteristic of the impulse response is inverted, and is subjected to predetermined weighting (e.g., weighting according to an amplitude characteristic of a sound-field to be generated by the acoustic system 1). Of the weighted amplitude characteristic, an amplitude characteristic within the correction frequency range set in step S21 (setting of correction condition) is obtained as a target amplitude characteristic to be targeted for the sound-field correction. FIG. 6 shows an example of the target amplitude characteristic generated and obtained herein.

(S24 in FIG. 3A (Generation of a Plurality of Auxiliary Target Amplitude Characteristics))

In step S24, the calculating unit 124 generates a plurality of auxiliary target amplitude characteristics in the same way as that for the target amplitude characteristic generated in step S23 (generation of target amplitude characteristic). In this embodiment, three types of auxiliary target amplitude characteristics are generated. The first one is generated by executing the averaging process in resolution substantially equal to the 1/1 octave band width, and is referred to as "first auxiliary target amplitude characteristic" for convenience of explanation. The second one is generated by executing the averaging process in resolution substantially equal to the 1/2 octave band width, and is referred to as "second auxiliary target amplitude characteristic" for convenience of explanation. The third one is generated by executing the averaging process in resolution substantially equal to the 1/3 octave band width which is equal to the target amplitude characteristic, and is referred to as "third auxiliary target amplitude characteristic" for convenience of explanation. As the octave band width defining the resolution in which the averaging process for generating the auxiliary target amplitude characteristic is executed becomes wider, the amplitude characteristic becomes gentler.

Figure 7A:
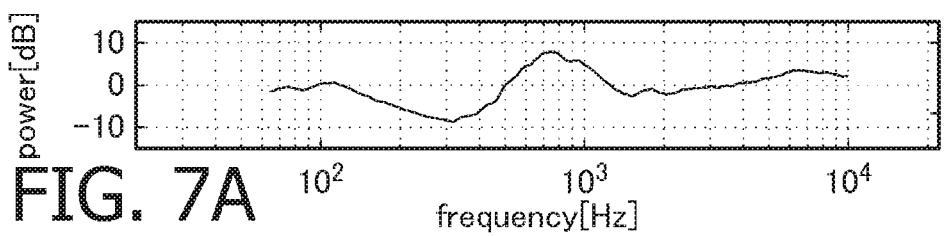
FIGS. 7A to 7C show examples of auxiliary target amplitude characteristics generated in step S24 (generation of a plurality of auxiliary target amplitude characteristics) in FIG. 3A.
Figure 7B:
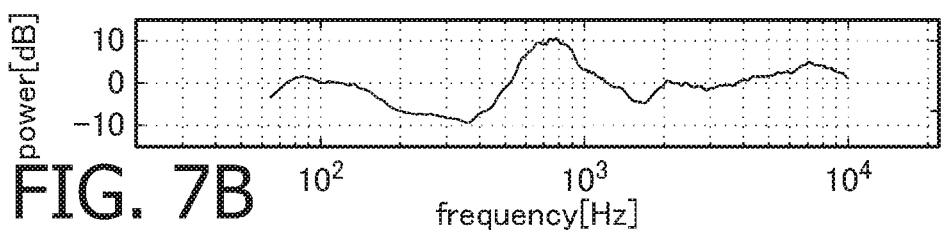
Figure 7C:
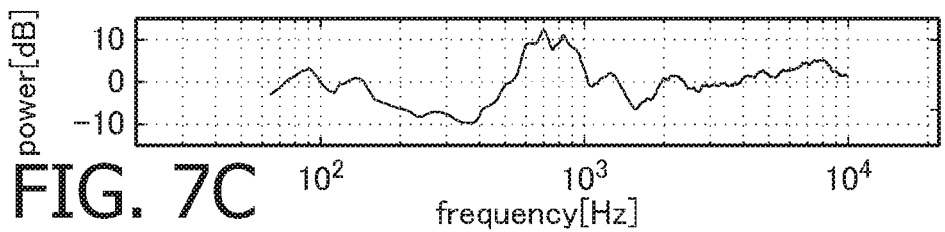

FIG. 7A shows an example of the first auxiliary target amplitude characteristic, FIG. 7B shows an example of the second auxiliary target amplitude characteristic, and FIG. 7C shows an example of the third auxiliary target amplitude characteristic. It should be noted that, in each of FIGS. 7A to 7C, in order to appropriately illustrate three graphs within the drawing, the scale of the vertical axis is largely differentiated from those of the other drawings (e.g., FIGS. 4 to 6). As shown in FIG. 7C, the third auxiliary target amplitude characteristic has an amplitude characteristic approximately equal to the target amplitude characteristic. By contrast, as shown in FIG. 7B, the second auxiliary target amplitude characteristic has an amplitude characteristic gentler than the third auxiliary target amplitude characteristic (or the target amplitude characteristic). As shown in FIG. 7A, the first auxiliary target amplitude characteristic has an amplitude characteristic gentler than the second auxiliary target amplitude characteristic. That is, in step S24, a plurality of auxiliary target amplitude characteristics which are gentler than or approximately equal to the target amplitude characteristic are generated.

S25 in FIG. 3A (Grouping Process for Each Auxiliary Target Amplitude Characteristic)

Figure 8A:
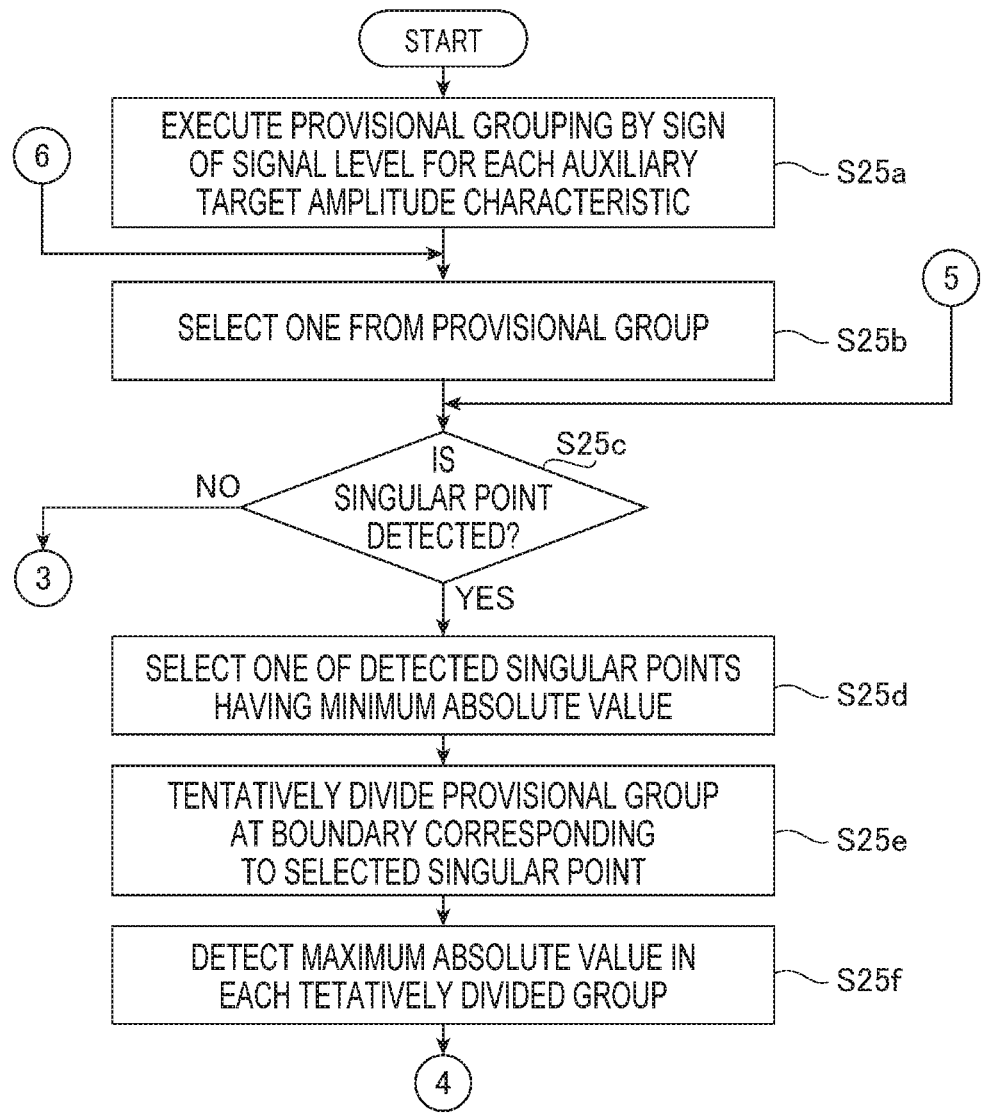
FIG. 8A is a flowchart illustrating step S25 (grouping process for each auxiliary target amplitude characteristic) in FIG. 3A.
Figure 8B:
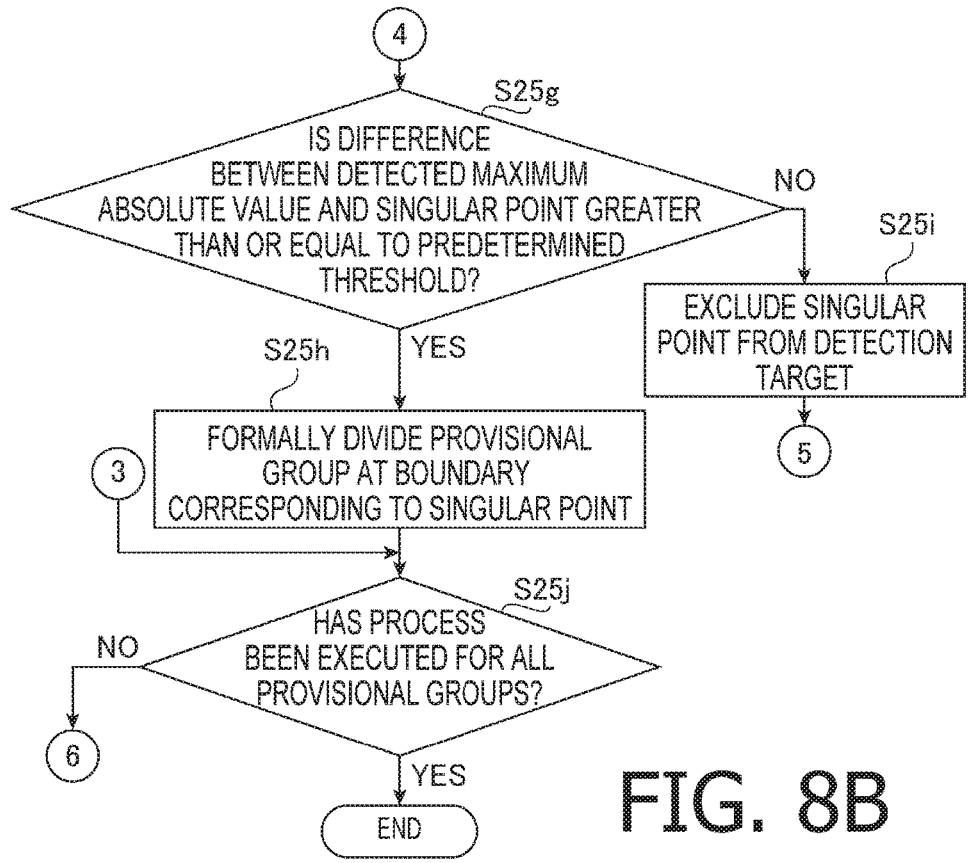
FIG. 8B is a flowchart illustrating step S25 (grouping process for each auxiliary target amplitude characteristic) in FIG. 3A.

In step S25, the calculating unit 124 executes a grouping process for each auxiliary target amplitude characteristic generated in step S24 (generation of a plurality of auxiliary target amplitude characteristics). FIGS. 8A and 8B show a flowchart illustrating the grouping process executed in step S25.

S25a in FIG. 8A

In step S25a, provisional grouping by the sign of the signal level is executed for each of the auxiliary target amplitude characteristics generated in step S24 (generation of a plurality of auxiliary target amplitude characteristics). More specifically, the auxiliary target amplitude characteristic is grouped by a frequency range within which a positive or negative signal level continues (i.e., a frequency range not having inversion of the sign).

S25b in FIG. 8A

In step S25b, one provisional group is selected from among the provisional groups grouped provisionally in step S25a.

S25c in FIG. 8A

In step S25c, a detecting process is executed for detecting a singular point in the provisional group selected in step S25b. When no singular point is detected in step S25c (S25c: NO), the provisional group selected in step S25b is determined as a regular group, and the process proceeds to step S25j. When a singular point is detected (S25c: YES), the process proceeds to step S25d. In this case, at least one local minimum is detected in a positive provisional group (a frequency range in which the positive signal level continues), and at least one local maximum is detected in a negative provisional group (a frequency range in which the negative signal level continues).

S25d in FIG. 8A

In step S25d, a singular point having the minimum absolute value is selected from among the singular points detected in step S25c.

S25e in FIG. 8A

In step S25e, the provisional group is tentatively divided at a boundary corresponding to the singular point selected in step S25d.

S25f in FIG. 8A

In step S25f, a maximum absolute value in each tentatively divided group in step S25e is detected.

S25g in FIG. 8B

In step S25g, it is judged whether a difference between the absolute value of the singular point selected in step S25d (the minimum absolute value in the provisional group) and the maximum absolute value in the tentatively divided group detected in step S25f is greater than or equal to a predetermined threshold.

S25h in FIG. 8B

Step S25h is executed when it is judged that the above described difference is greater than or equal to the predetermined threshold (S25g: YES). In step S25h, the provisional group is divided at a boundary corresponding to the singular point selected in step S25d, and the divided groups are determined as two regular groups.

S25i in FIG. 8B

Step S25i is executed when it is judged that the above described difference is smaller than the predetermined threshold (S25g: NO). In step S25i, the singular point selected in step S25d is excluded from the detection target in step S25c. Then, the grouping process in this flowchart returns to step S25c.

S25j in FIG. 8B

In step S25j, it is judged whether the steps after step S25c ((the steps for determining the regular groups)) have been executed for all the provisional groups. The grouping process shown in this flowchart returns to step S25b when an unprocessed step remains (S25j: NO), and is terminated when all the provisional groups have been processed (S25j: YES).

Figure 9:
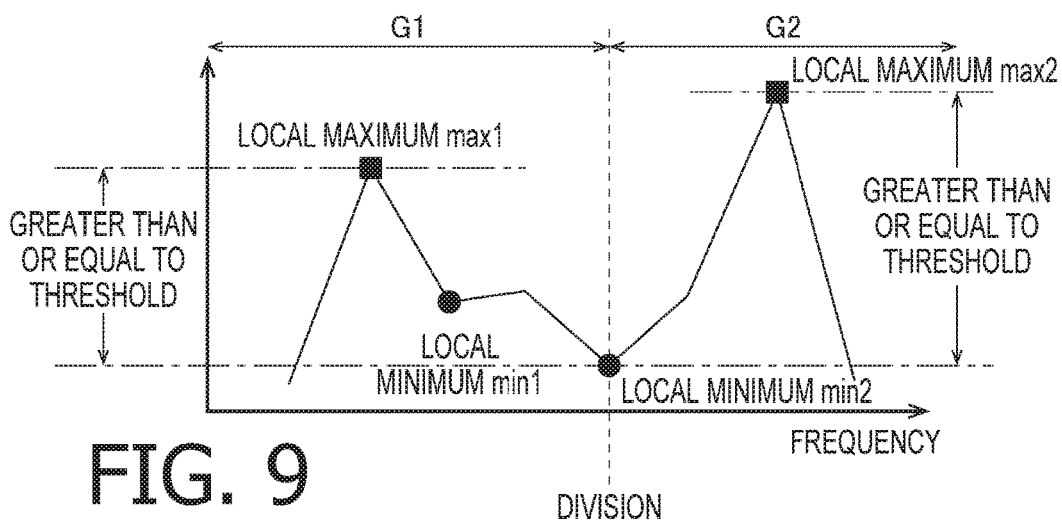
FIG. 9 schematically illustrates an example of a positive provisional group selected in step S25$d$ in FIG. 8A.

FIG. 9 schematically illustrates an example of the positive provisional group selected in step S25d. In the example shown in FIG. 9, the local minimums min1 and min2 are detected in step S25c. In step S25d, the local minimum min2 having a smaller absolute value is selected. In step S25e, the provisional group is tentatively divided at a boundary corresponding to the local minimum min2. In step S25f, local maximums max1 and max2 are detected in respective tentatively divided groups G1 and G2. In step S25g, it is judged whether both of the difference between the local minimum min2 and the local maximum max1 and the difference between the local minimum min2 and the local maximum max2 are greater than or equal to the predetermined threshold. Since, in the example shown in FIG. 9, both of the differences are greater than or equal to the predetermined threshold, the tentative divided groups G1 and G2 are determined as the regular groups.

Figure 10A:
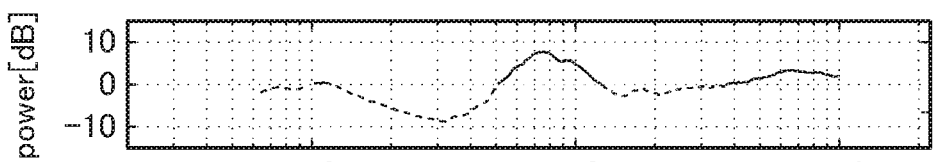
FIGS. 10A to 10C show examples of results of execution of step S25$g$ (grouping process for each auxiliary target amplitude characteristic) in FIG. 3A.
Figure 10B:
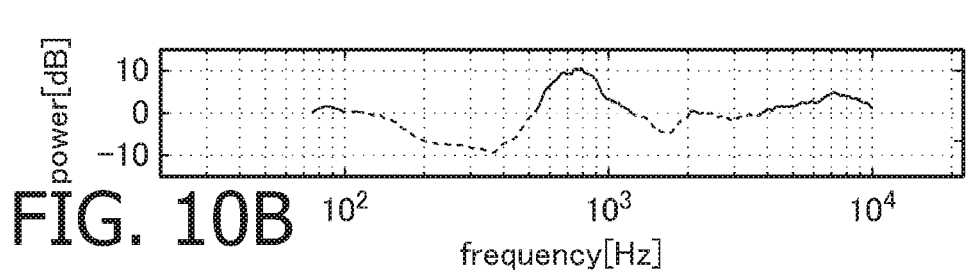
Figure 10C:
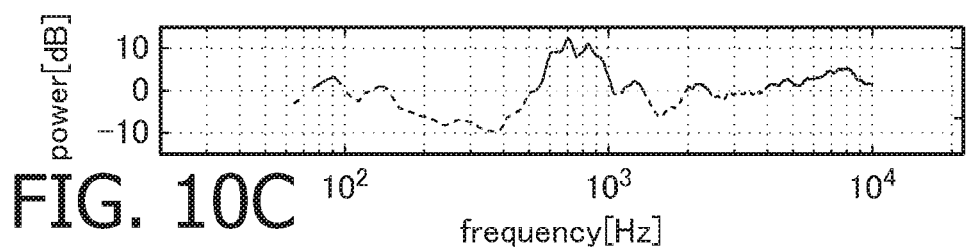

FIGS. 10A to 10C show examples of results of the grouping process for each of the auxiliary target amplitude characteristics when the threshold used for the judgment in step S25g is 1. In each of FIGS. 10A to 10C, the amplitude characteristic indicated by a solid line represents the regular group having a positive signal level, and the amplitude characteristic indicated by a dashed line represents the regular group having a negative signal level. FIGS. 10A, 10B and 10C respectively show results of the grouping process for the first, second and third auxiliary target amplitude characteristic, respectively. As shown in each of FIGS. 10A, 10B and 10C, the first, second and third auxiliary target amplitude characteristics are divided into nine groups, fourteen groups and fifteen groups, respectively.

(S26 in FIG. 3A (Calculation of Priority of Each Group))

Figure 11:
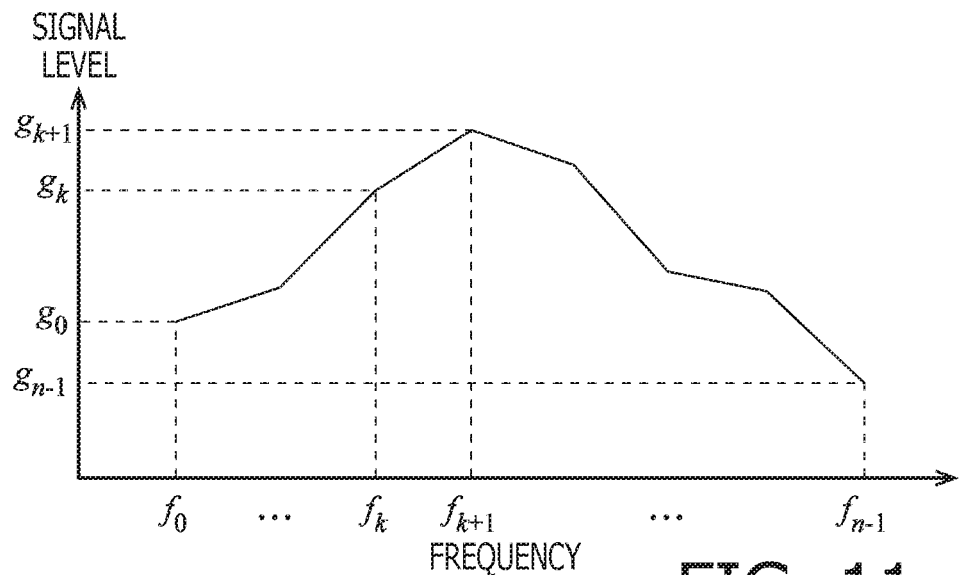
FIG. 11 schematically illustrates an amplitude characteristic of a regular group for which priority is calculated in step S26 (calculation of priority of each group) in FIG. 3A.

In step S26, the calculating unit 124 calculates the priority of the regular group for each of the auxiliary target amplitude characteristics based on the signal level of the regular group. FIG. 11 schematically illustrates the amplitude characteristic of the regular group for which the priority is calculated. In FIG. 11, frequencies corresponding to the signal levels $g_{n-1}$, $g_0$, ... $g_k$, $g_{k-1}$ are defined as $f_{n-1}$, $f_0$, ... $f_k$, $f_{k+1}$, respectively. In this case, the priority of each regular group of each of the auxiliary target amplitude characteristics is calculated in accordance with the following expression 1.

$$p = \sum_{k=0}^{n-2} \frac{(|g_k + g_{k+1}|)\log_{10}\left(\frac{f_{k+1}}{f_k}\right)}{2} \quad \text{(Expression 1)}$$

(S27 in FIG. 3A (Selection of Group Based on Priority))

In step S27, the calculating unit 124 selects, for each of the auxiliary target amplitude characteristics, a regular group having the highest priority based on the calculation result in step S26 (calculation of priority of each group). In the following, for convenience of explanation, the regular group having the highest priority in the first auxiliary target amplitude characteristic is assigned a reference number $G_{r1/1}$, the regular group having the highest priority in the second auxiliary target amplitude characteristic is assigned a reference number $G_{r1/1}$, and the regular group having the highest priority in the third auxiliary target amplitude characteristic is assigned a reference number $G_{r1/1}$.

Figure 12A:
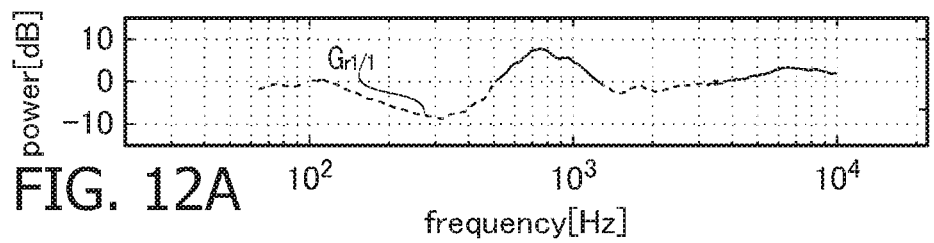
FIGS. 12A to 12C respectively show examples of correction target candidate groups selected in step 27 (selection of group based on priority) in FIG. 3A.
Figure 12B:
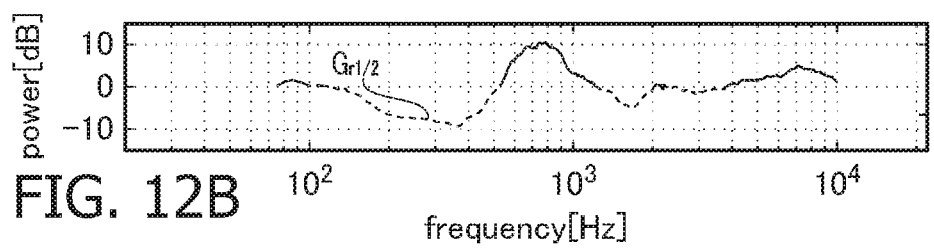
Figure 12C:
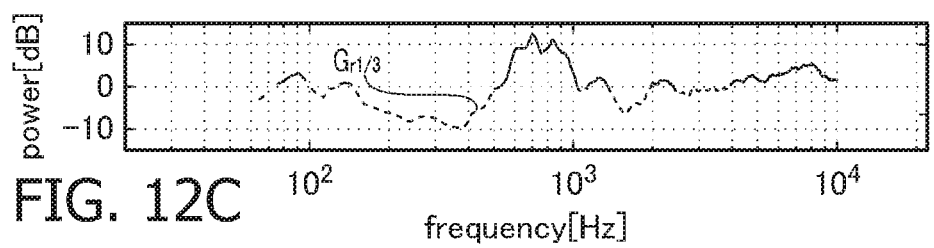

The regular groups $G_{r1/1}$, $G_{r1/2}$ and $G_{r1/3}$ selected in step S27 are groups of the correction target candidates. FIGS. 12A, 12B and 12C respectively show examples of the correction target candidate groups $G_{r1/1}$, $G_{r1/2}$ and $G_{r1/3}$ selected in step S12.

(S28 in FIG. 3B (Calculation of Center Frequency))

In step S28, the calculating unit 124 calculates, for each of the auxiliary target amplitude characteristics, the center frequency (the barycenter position) of the correction candidate PEQ based on the correction target candidate group selected in step S27 (selection of group based on priority). When the signal level and the frequency in the correction target candidate group are defined as shown in FIG. 11, the center frequency of the correction candidate PEQ is calculated by the following expression (2).

$$f = \frac{\sum_{k=0}^{n-1} \log_{10}(f_k)|g_k|}{\sum_{k=0}^{n-1} |g_k|} \quad \text{(Expression 2)}$$

(S29 in FIG. 3B (Calculation of Gain))

In step S29, the calculating unit 124 calculates, for each of the auxiliary target amplitude characteristics, the gain of the correction candidate PEQ based on the correction target candidate group selected in step S27 (selection of group based on priority). When the signal level and the frequency in the correction target candidate group are defined as shown in FIG. 11, the gain of the correction candidate PEQ is calculated by the following expression (3).

$$g = g_{index}(\min(|f - f_k|)) \quad \text{(Expression 3)}$$

(S30 in FIG. 3B (Calculation of Frequency Band Width))

In step S30, the calculating unit 124 calculates, for each of the auxiliary target amplitude characteristics, the frequency band width of the correction candidate PEQ based on the correction target candidate group selected in step S27 (selection of group based on priority). When the signal level and the frequency in the correction target candidate group are defined as shown in FIG. 11, the frequency band width of the correction candidate PEQ is calculated by the following expression (4).

$$w = \frac{f_{n-1} - f_0}{\sqrt{|g|}} \quad \text{(Expression 4)}$$

Figure 13A:
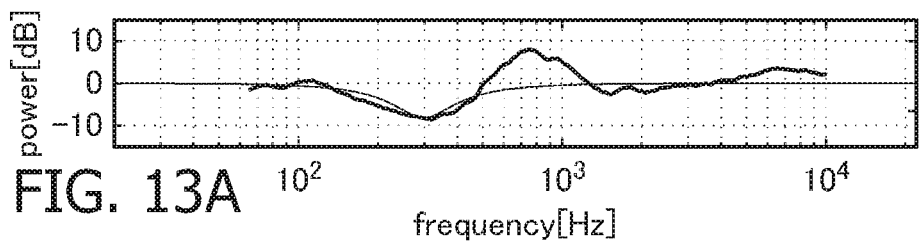
FIGS. 13A to 13C show the auxiliary target amplitude characteristics and the respective amplitude characteristics of the correction candidates PEQ.
Figure 13B:
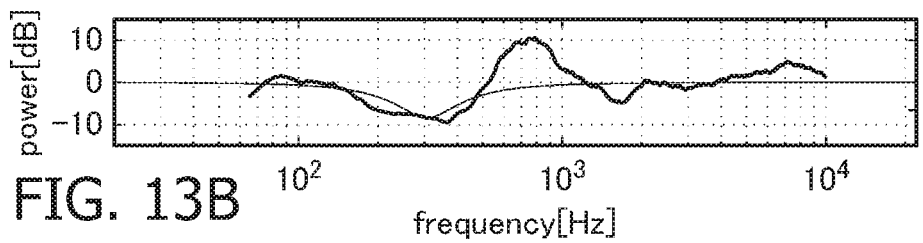
Figure 13C:
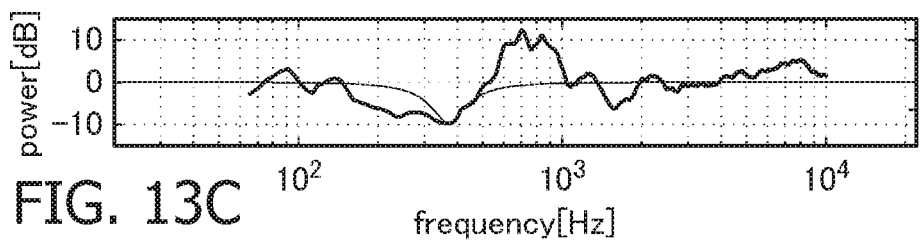

By calculating the center frequency, the gain and the frequency band width of the correction candidate PEQ, the amplitude characteristic of the correction candidate PEQ can be obtained. FIG. 13A shows the first auxiliary target amplitude characteristic (a thick solid line) and the amplitude characteristic (a thin solid line) of the first correction candidate PEQ generated from the first auxiliary target amplitude characteristic. FIG. 13B shows the second auxiliary target amplitude characteristic (a thick solid line) and the amplitude characteristic (a thin solid line) of the second correction candidate PEQ generated from the second auxiliary target amplitude characteristic. FIG. 13C shows the third auxiliary target amplitude characteristic (a thick solid line) and the amplitude characteristic (a thin solid line) of the third correction candidate PEQ generated from the third auxiliary target amplitude characteristic.

(S31 in FIG. 3B (Selection of Correction Target PEQ))

In step S31, the calculating unit 124 compares the target amplitude characteristic with the amplitude characteristics of the first to third correction candidates PEQ, and the correction candidate PEQ having the smallest difference with respect to the target amplitude characteristic is selected as one of correction targets PEQ. Parameters (the center frequency, the gain and the frequency band width) of the correction target PEQ selected as the one of correction targets PEQ are stored in the internal memory 100M of the controller 100.

Figure 14A:
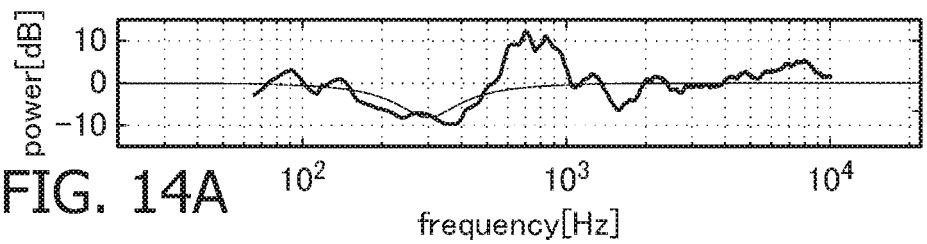
FIGS. 14A to 14C show the target amplitude characteristics and the respective amplitude characteristics of the correction candidates PEQ.
Figure 14B:
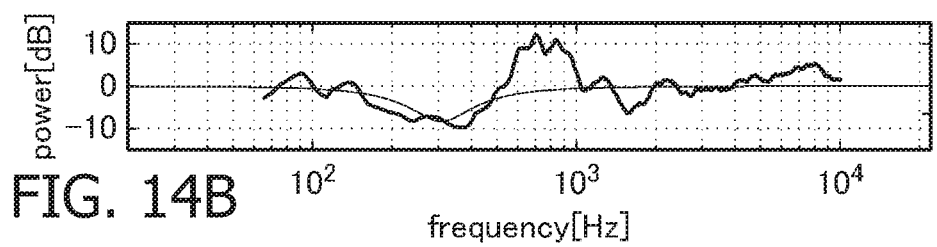
Figure 14C:
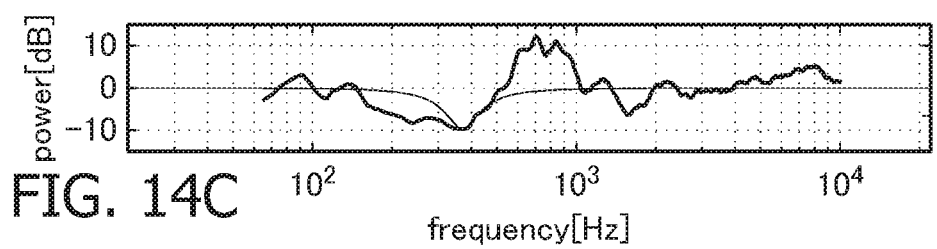

FIGS. 14A. 14B and 14C respectively show the target amplitude characteristic (a solid line) and the amplitude characteristics (a thin line) of the first, the second and the third correction candidates PEQ. In the examples shown in FIGS. 14A-14C, the correction candidate PEQ having the smallest difference with respect to the target amplitude characteristic is the second correction candidate PEQ. Therefore, the second correction candidate PEQ is selected as the one of correction targets PEQ.

(S32 in FIG. 3B (Calculation of New Auxiliary Target Amplitude Characteristic))

Figure 15A:
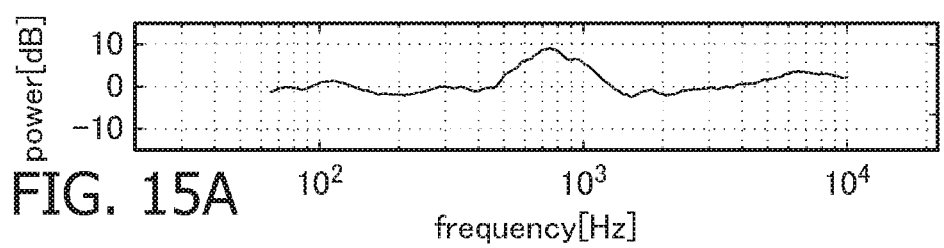
FIG. 15A to 15C show new auxiliary target amplitude characteristics calculated in step S32 (calculation of new auxiliary target amplitude characteristic) in FIG. 3B.
Figure 15B:
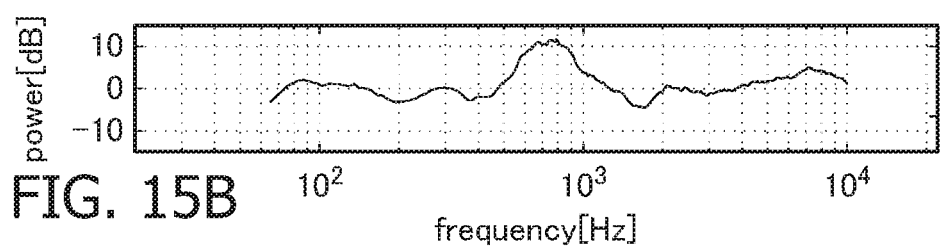
Figure 15C:
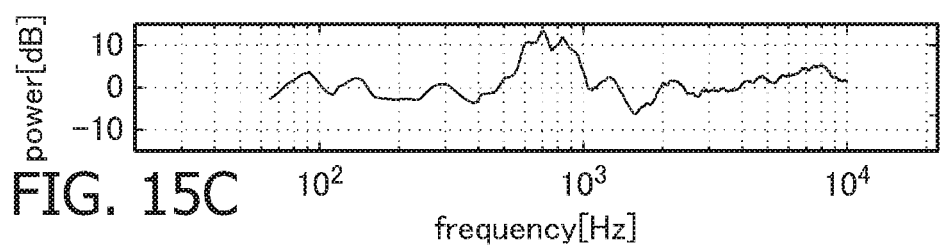

In step S32, the calculating unit 124 calculates, as a new auxiliary target amplitude characteristic, the difference between the amplitude characteristic of the correction target PEQ selected in step S31 (selection of correction target PEQ) and each auxiliary target amplitude characteristic. FIG. 15A shows the difference (a new first auxiliary target amplitude characteristic) between the amplitude characteristic of the correction target PEQ and the first auxiliary target amplitude characteristic. FIG. 15B shows the difference (a new second auxiliary target amplitude characteristic) between the amplitude characteristic of the correction target PEQ and the second auxiliary target amplitude characteristic. FIG. 15C shows the difference (a new third auxiliary target amplitude characteristic) between the amplitude characteristic of the correction target PEQ and the third auxiliary target amplitude characteristic.

(S33 in FIG. 3B (Calculation of New Target Amplitude Characteristic))

Figure 16:
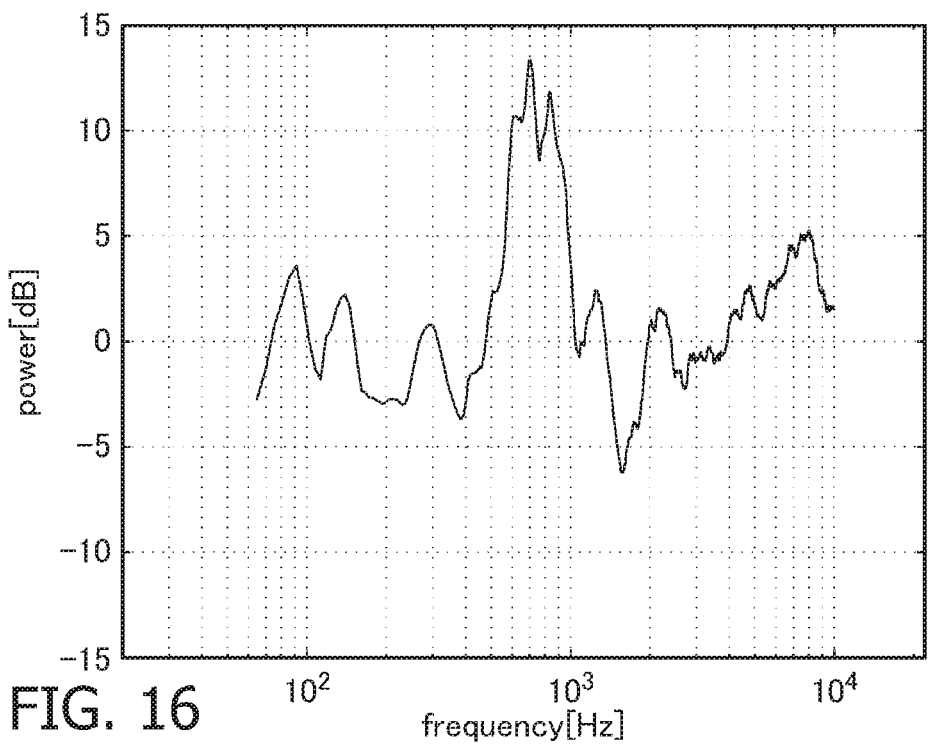
FIG. 16 shows a new target amplitude characteristic calculated in step S33 (calculation of new target amplitude characteristic) in FIG. 3B.

In step S33, the calculating unit 124 calculates, as a new target amplitude characteristic, the difference between the correction target PEQ selected in step S31 (selection of correction target PEQ) and the target amplitude characteristic. FIG. 16 shows the difference (a new target amplitude characteristic) between the amplitude characteristic of the correction target PEQ and the target amplitude characteristic.

(S34 in FIG. 3B (Judgment on Termination))

In step S34, the calculating unit 124 judges whether the number of correction targets PEQ for which the parameters are stored by execution of step S31 (selection of correction target PEQ) reaches the PEQ band number set in step S21 (setting of correction condition). The sound-field correction process in the present flowchart is terminated when the number of correction targets PEQ stored in the internal memory 100M of the controller 100 reaches the PEQ band number (S34: YES). When it is judged that the number of correction targets PEQ does not reach the PEQ band number (S34: NO), the process returns to step S25 (grouping process for each auxiliary target amplitude characteristic), and steps after step S25 are repeatedly executed using the new auxiliary target amplitude characteristics calculated in step S32 (calculation of new auxiliary target amplitude characteristic) and the new target amplitude characteristic calculated in step S32 (calculation of new auxiliary target amplitude characteristic).

Each time the steps S25 to S34 are looped, the parameters (the center frequency, the gain and the frequency band width) of the correction target PEQ are sequentially stored in the internal memory 100M of the controller 100 while updating the target amplitude characteristic and each auxiliary target amplitude characteristic.

The PEQ unit 110 is an IIR (Infinite Impulse Response) filter, and includes a plurality of equalizers each of which is configured such that parameters (the center frequency, the gain and the frequency band width) are adjustable. By setting the parameters of each correction target PEQ stored in the internal memory 100M of the controller 100 to the PEQ unit 110, the correction amplitude characteristic nearly equal to the target amplitude characteristic is set. The PEQ unit 110 corrects the sound-field by adjusting the signal level for each frequency band in accordance with the correction amplitude characteristic, with respect to the sound signal, such as CD (Compact Disc) or DVD (Digital Versatile Disc), read by the recording medium reproducing unit 108.

Figure 17A:
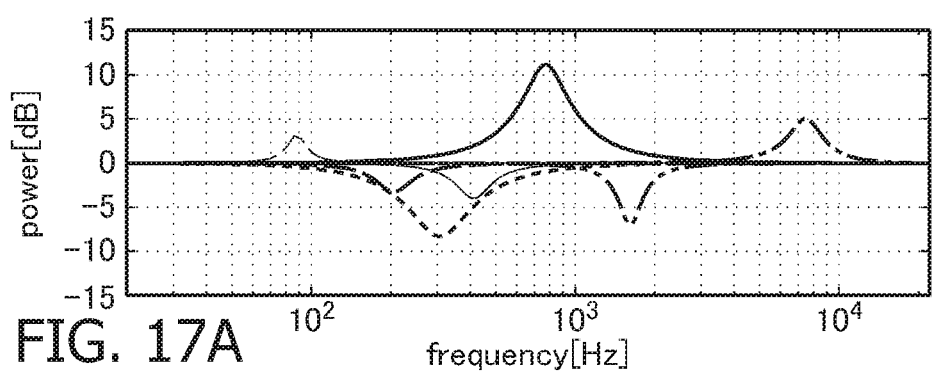
FIG. 17A shows the parameter of each correction target PEQ stored in an internal memory 1 of a controller according to the embodiment of the invention.
Figure 17B:
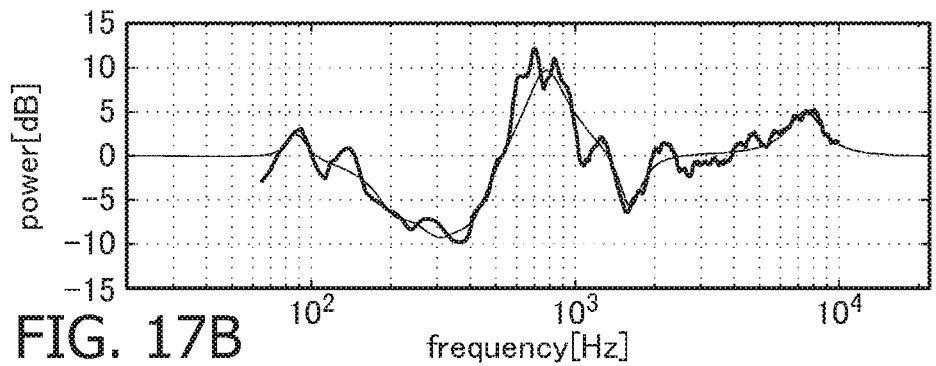
FIG. 17B shows a target amplitude characteristic and a correction amplitude characteristic nearly equal to the target amplitude characteristic.

FIG. 17A shows the parameters of each correction target PEQ stored in the internal memory 100M of the controller 100, and FIG. 17B shows the target amplitude characteristic (a thick solid line) and the correction amplitude characteristic (a thin solid line) nearly equal to the target amplitude characteristic. As shown in FIG. 17B, the correction amplitude characteristic is nearly equal to the target amplitude characteristic and is precisely corrected.

As described above, according to the embodiment of the invention, corrections from a rough (macroscopic) correction to a detailed (microscopic) correction are sequentially executed. Therefore, adequate sound-filed correction effects can be obtained even when the number of PEQ bands is small. Furthermore, since the sound-filed correction can be performed in a simple configuration, the processing time for the sound-filed correction can be suitably decreased.

Figure 18A:
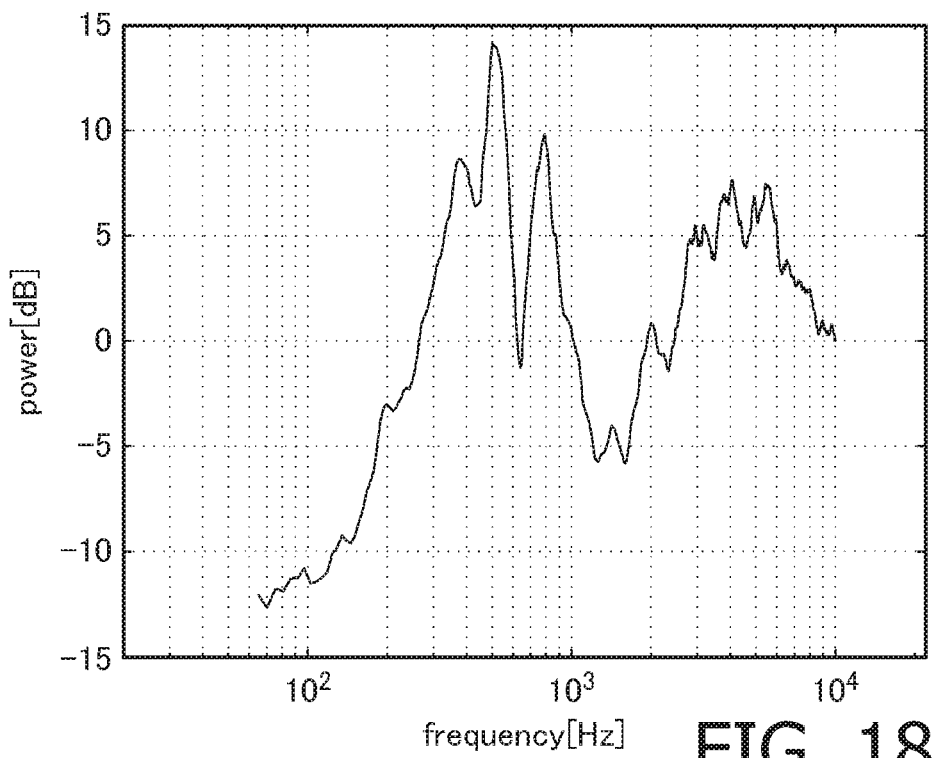
FIGS. 18A and 18B illustrate results of comparison between an error of a target amplitude characteristic and a PEQ band number in regard to a prior art (the patent document 2) and the embodiment.
Figure 18B:
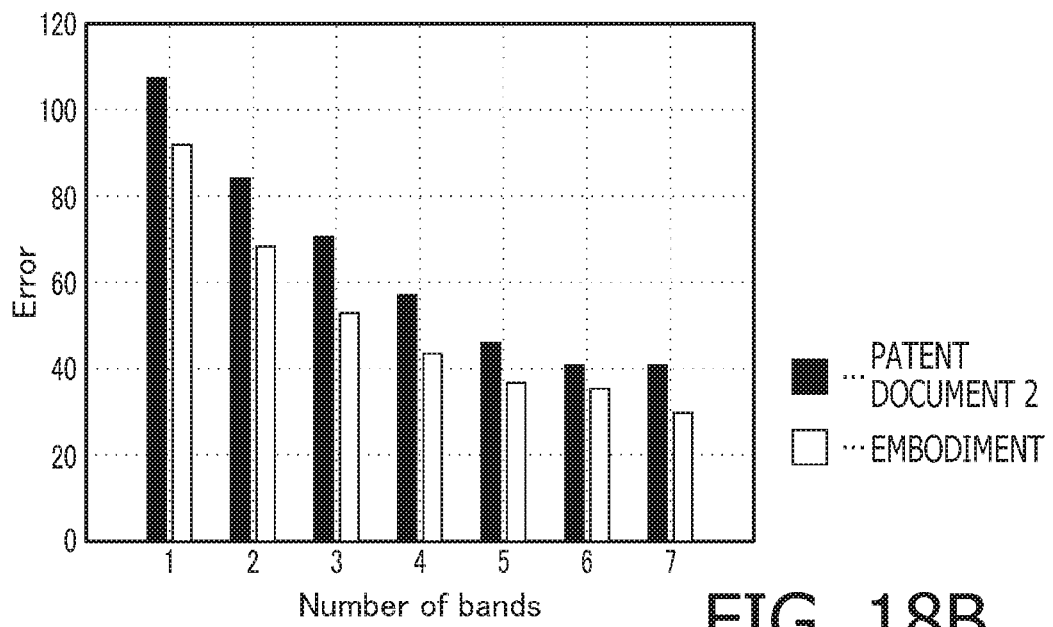

FIG. 18A shows an example of the target amplitude characteristic. FIG. 18B shows a comparison result between the embodiment and the prior art (the patent document 2), showing an error with respect to the target amplitude characteristic for the respective numbers of PEQ bands when the amplitude characteristic shown in FIG. 18A is set as the target amplitude characteristic. As shown in FIG. 18B, according to the embodiment, the error of the sound-filed correction is decreased by approximately 15% to 25% with respect to the prior art. That is, it is understood that, according to the embodiment, adequate sound-filed correction effects can be obtained even when the number of PEQ bands is small.

The foregoing is the explanation about the embodiment of the invention. The invention is not limited to the above described embodiment, but can be varied in various ways within the scope of the invention. For example, embodiments of the invention include a combination of embodiments explicitly described in this specification and embodiments easily realized from the above described embodiment.

In the above described embodiment, the acoustic system corrects the sound-filed in the vehicle interior: however, the present invention is not limited to such an example. In another embodiment, the acoustic system may correct the sound-field in another particular space, such as a house. In the above described embodiment, the acoustic system includes a plurality of speakers; however, in another embodiment, an acoustic system may include a single speaker.

In the above described embodiment, a single device (the sound-filed device 10) has the sound-filed measuring function and the sound-filed correction function; however, the present invention is not limited to such an example. In another embodiment, an acoustic system may be formed of a plurality of devices, and the sound-filed measuring function and the sound-filed correction function may be implemented on different devices constituting the acoustic system. For example, a configuration where an information processing terminal, such as a smartphone, executes the sound-filed measuring and a device, such as an in-vehicle device, executes the sound-filed correction based on the measurement result can be considered.

What is claimed is:

1. A sound-field correction device, comprising:
   a target calculating unit configured to calculate, based on a predetermined sound signal, a target amplitude characteristic targeted for sound-field correction by a parametric equalizer and a plurality of auxiliary target amplitude characteristics having amplitude characteristics approximately equal to or gentler than the target amplitude characteristic;
   a correction amplitude characteristic calculating unit configured to calculate a correction amplitude characteristic for correcting sound-field based on the calculated target amplitude characteristic and the calculated plurality of auxiliary target amplitude characteristics by
      selecting a frequency band for respective auxiliary target amplitude characteristics based on an amplitude characteristic of the respective auxiliary target amplitude characteristic,
      calculating a correction parameter for the respective auxiliary target amplitude characteristics based on an amplitude characteristic of the respective auxiliary target amplitude characteristics within the selected frequency band, and
      selecting a correction parameter closest to the target amplitude characteristic from among the calculated correction parameters for the respective auxiliary target amplitude characteristics; and
   a setting unit configured to set the parametric equalizer based on the calculated correction amplitude characteristic.

2. The sound-field correction device according to claim 1, wherein:
   the target calculating unit is configured to calculate an amplitude characteristic of the sound signal based on the sound signal, to subject the calculated amplitude characteristic to an averaging process in a first resolution, and to calculate the target amplitude characteristic based on the amplitude characteristic subjected to the averaging process; and
   the target calculating unit is configured to calculate the amplitude characteristic of the sound signal based on the sound signal, to subject the calculated amplitude characteristic to an averaging process in a resolution approximately equal to the first resolution or in a plurality of types of resolutions which are rougher than the first resolution and are different from each other, and to calculate the plurality of auxiliary target amplitude characteristics based on the amplitude characteristics subjected to the averaging process in the plurality of types of resolutions different from each other.

3. The sound-field correction device according to claim 1, wherein:
   the correction amplitude characteristic calculating unit is configured to divide each of the auxiliary target amplitude characteristics into a plurality of groups in a frequency domain based on a predetermined condition, to calculate priority of each of the divided groups, and to select a group having highest calculated priority for each of the auxiliary target amplitude characteristics;
   the correction amplitude characteristic calculating unit is configured to calculate a parameter of the parametric equalizer of a correction candidate for each of the auxiliary target amplitude characteristics based on the selected group in the frequency domain, and to obtain the parameter of the parametric equalizer of a correction target based on the calculated parameter of each of the auxiliary target amplitude characteristics; and
   the setting unit is configured to set the parametric equalizer based on the parameter of the parametric equalizer of the correction target.

4. The sound-field correction device according to claim 3, wherein the correction amplitude characteristic calculating unit is configured to calculate an amplitude characteristic of the correction candidate for each of the auxiliary target amplitude characteristics based on the parameter of the parametric equalizer of the correction candidate, and to obtain, as the parameter of the parametric equalizer of the correction target, the parameter of one of amplitude characteristics of the calculated respective correction candidates having a smallest difference with respect to the target amplitude characteristic.

5. The sound-field correction device according to claim 3, wherein:
   when the parameter of the parametric equalizer of the correction target is obtained, the correction amplitude characteristic calculating unit calculates, as a new target amplitude characteristic, a difference between the target amplitude characteristic and one of the amplitude characteristics of the correction candidates calculated for the respective auxiliary target amplitude characteristics having a smallest difference with respect to the target amplitude characteristic, and calculates, as a new plurality of auxiliary target amplitude characteristics, differences between the amplitude characteristic of the correction target and the respective auxiliary target amplitude characteristics; and
   when a number of obtained parametric equalizers of the correction target does not reach a predetermined number, the correction amplitude characteristic calculating unit further obtains the parameter of the parametric equalizer of the correction target based on the new target amplitude characteristic and the new plurality of auxiliary target amplitude characteristic.

6. The sound-field correction device according to claim 3, wherein the parameter includes a center frequency, a gain and a frequency band width.

7. A sound-field correction method, comprising:
   calculating, based on a predetermined sound signal, a target amplitude characteristic targeted for sound-field correction by a parametric equalizer and a plurality of auxiliary target amplitude characteristics having amplitude characteristics approximately equal to or gentler than the target amplitude characteristic;

calculating a correction amplitude characteristic for correcting sound-field based on the calculated target amplitude characteristic and the calculated plurality of auxiliary target amplitude characteristics by selecting a frequency band for respective auxiliary target amplitude characteristics based on an amplitude characteristic of the respective auxiliary target amplitude characteristics;

calculating a correction parameter for the respective auxiliary target amplitude characteristics based on an amplitude characteristic of the respective auxiliary target amplitude characteristics within the selected frequency band, and selecting a correction parameter closest to the target amplitude characteristic from among the calculated correction parameters for the respective auxiliary target amplitude characteristics; and setting the parametric equalizer based on the calculated correction amplitude characteristic.

8. The sound-field correction method according to claim 7, wherein the calculating the target amplitude characteristic comprises:

calculating an amplitude characteristic of the sound signal based on the sound signal, subjecting the calculated amplitude characteristic to an averaging process in a first resolution, and calculating the target amplitude characteristic based on the amplitude characteristic subjected to the averaging process; and calculating the amplitude characteristic of the sound signal based on the sound signal, subjecting the calculated amplitude characteristic to an averaging process in a resolution approximately equal to the first resolution or in a plurality of types of resolutions which are rougher than the first resolution and are different from each other, and calculating the plurality of auxiliary target amplitude characteristics based on the amplitude characteristics subjected to the averaging process in the plurality of types of resolutions different from each other.

9. The sound-field correction method according to claim 7, wherein the calculating the correction amplitude characteristic comprises:

dividing each of the auxiliary target amplitude characteristics into a plurality of groups in a frequency domain based on a predetermined condition, calculating priority of each of the divided groups, and selecting a group having highest calculated priority for each of the auxiliary target amplitude characteristics; and calculating a parameter of the parametric equalizer of a correction candidate for each of the auxiliary target amplitude characteristics based on the selected group in the frequency domain, and obtaining the parameter of the parametric equalizer of a correction target based on the calculated parameter of each of the auxiliary target amplitude characteristics, and wherein the setting the parametric equalizer comprises setting the parametric equalizer based on the parameter of the parametric equalizer of the correction target.

10. The sound-field correction device according to claim 9, wherein the calculating the correction amplitude characteristic comprises calculating an amplitude characteristic of the correction candidate for each of the auxiliary target amplitude characteristics based on the parameter of the parametric equalizer of the correction candidate, and obtaining, as the parameter of the parametric equalizer of the correction target, the parameter of one of amplitude characteristics of the calculated respective correction candidates having a smallest difference with respect to the target amplitude characteristic.

11. The sound-field correction device according to claim 9, wherein the calculating the correction amplitude characteristic comprises:

when the parameter of the parametric equalizer of the correction target is obtained, calculating, as a new target amplitude characteristic, a difference between the target amplitude characteristic and one of the amplitude characteristics of the correction candidates calculated for the respective auxiliary target amplitude characteristics having a smallest difference with respect to the target amplitude characteristic, and calculating, as a new plurality of auxiliary target amplitude characteristics, differences between the amplitude characteristic of the correction target and the respective auxiliary target amplitude characteristics; and when a number of obtained parametric equalizers of the correction target does not reach a predetermined number, further obtaining the parameter of the parametric equalizer of the correction target based on the new target amplitude characteristic and the new plurality of auxiliary target amplitude characteristic.

12. The sound-field correction method according to claim 9, wherein the parameter includes a center frequency, a gain and a frequency band width.

13. A non-transitory computer readable medium having computer readable instruction stored thereon, which, when executed by a processor of a sound-field correction device, configures the processor to perform:

calculating, based on a predetermined sound signal, a target amplitude characteristic targeted for sound-field correction by a parametric equalizer and a plurality of auxiliary target amplitude characteristics having amplitude characteristics approximately equal to or gentler than the target amplitude characteristic;

calculating a correction amplitude characteristic for correcting sound-field based on the calculated target amplitude characteristic and the calculated plurality of auxiliary target amplitude characteristics by selecting a frequency band for respective auxiliary target amplitude characteristics based on an amplitude characteristic of the respective auxiliary target amplitude characteristics, calculating a correction parameter for the respective auxiliary target amplitude characteristics based on an amplitude characteristic of the respective auxiliary target amplitude characteristics within the selected frequency band, and selecting a correction parameter closest to the target amplitude characteristic from among the calculated correction parameters for the respective auxiliary target amplitude characteristics; and setting the parametric equalizer based on the calculated correction amplitude characteristic.

* * * * *